United States Patent
Han et al.

(10) Patent No.: US 10,884,085 B2
(45) Date of Patent: Jan. 5, 2021

(54) K-SPACE DATA CORRECTION METHOD FOR SIGNAL VARIATION COMPENSATION

(71) Applicant: Siemens Healthcare GmbH, Erlangen (DE)

(72) Inventors: Fei Han, Beverly Hills, CA (US); Xiaoming Bi, Oak Park, CA (US); Xiaodong Zhong, Oak Park, CA (US); Jin Jin, Algester (AU)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 16/371,196

(22) Filed: Apr. 1, 2019

(65) Prior Publication Data

US 2020/0309882 A1    Oct. 1, 2020

(51) Int. Cl.
| | |
|---|---|
| *G01V 3/00* | (2006.01) |
| *G01R 33/48* | (2006.01) |
| *G01R 33/58* | (2006.01) |
| *G01R 33/565* | (2006.01) |
| *G01R 33/567* | (2006.01) |
| *G01R 33/561* | (2006.01) |

(Continued)

(52) U.S. Cl.
CPC ....... *G01R 33/4818* (2013.01); *G01R 33/565* (2013.01); *G01R 33/58* (2013.01); *G01R 33/446* (2013.01); *G01R 33/4831* (2013.01); *G01R 33/561* (2013.01); *G01R 33/5676* (2013.01)

(58) Field of Classification Search
CPC .............. G01R 33/543; G01R 33/5659; G01R 33/3415; G01R 33/36; A61B 5/055

USPC ......................................................... 324/309
See application file for complete search history.

(56) References Cited

U.S. PATENT DOCUMENTS

| | | | |
|---|---|---|---|
| 7,016,796 B2* | 3/2006 | Damle | G01R 19/02 702/190 |
| 2003/0060698 A1* | 3/2003 | Mistretta | G01R 33/28 600/410 |

(Continued)

OTHER PUBLICATIONS

Li, Tao, and Scott A. Mirowitz. "Fast T2-weighted MR imaging: impact of variation in pulse sequence parameters on image quality and artifacts." Magnetic resonance imaging 21.7 (2003): 745-753.

(Continued)

*Primary Examiner* — Walter L Lindsay, Jr.
*Assistant Examiner* — Frederick Wenderoth

(57) ABSTRACT

A system for performing magnetic resonance imaging (MRI) of a subject has a pulse sequence system that generates a pulse sequence and has a gradient system, a plurality of gradient coils, a radio-frequency system, and a plurality of RF coils. The pulse sequence system causes the subject to emit MR signals which are captured as k-space data. The system also has a k-space ordering processor that collects first k-space data and second k-space data, an MR signal modeler that generates a signal variation model, and a compensation module that applies the signal variation model to the second k-space data collected to produce compensated k-space data. A display processor reconstructs the compensated k-space data into an image of the subject. The compensated data accounts for variation in magnetization during the pulse sequence and k-space data collection to reduce artifacts in the images.

16 Claims, 6 Drawing Sheets

(51) Int. Cl.
*G01R 33/44* (2006.01)
*G01R 33/483* (2006.01)

(56) References Cited

U.S. PATENT DOCUMENTS

| | | | | |
|---|---|---|---|---|
| 2007/0045574 A1* | 3/2007 | Bruland | ............... | B23K 26/043 |
| | | | | 250/559.13 |
| 2009/0129648 A1* | 5/2009 | Arfanakis | ........ | G01R 33/56509 |
| | | | | 382/131 |
| 2010/0253339 A1* | 10/2010 | Gross | .................. | G01R 33/565 |
| | | | | 324/309 |
| 2012/0237100 A1* | 9/2012 | Grimm | ................ | G01R 33/565 |
| | | | | 382/131 |
| 2013/0253895 A1* | 9/2013 | Okell | ..................... | A61B 6/507 |
| | | | | 703/11 |
| 2016/0377693 A1* | 12/2016 | Pednekar | ............. | G01R 33/385 |
| | | | | 324/322 |
| 2017/0358095 A1* | 12/2017 | Levy | .................... | G01R 33/307 |

OTHER PUBLICATIONS

Altbach, Maria I., et al. "Radial fast spin-echo method for T2-weighted imaging and T2 mapping of the liver." Journal of Magnetic Resonance Imaging: An Official Journal of the International Society for Magnetic Resonance in Medicine16.2 (2002): 179-189.

\* cited by examiner

K-SPACE DATA CORRECTION METHOD FOR SIGNAL VARIATION COMPENSATION

TECHNICAL FIELD

The present invention relates to k-space data correction, and, more particularly to a k-space data correction method that compensates for signal variation over the course of data acquisition.

BACKGROUND

In most magnetic resonance (MR) imaging applications, it is preferred that all k-space components are acquired under the same signal condition. However, an MR signal is dynamic in nature because the spins undergo constant evolutions based on the physical property of the imaged object. In other words, the imaged object does not maintain the same magnetization at all times. T2 and T2* decay are examples of this signal evolution. Inconsistent signal within k-space data will lead to imaging artifacts that degrade the diagnostic quality.

In order to address this problem, the actual data acquisition in most MR pulse sequences usually happens within a small temporal window where the signal variation is relatively small (e.g., before T2 decay is pronounced). Because of the short acquisition window, the data acquisition has to be repeated to reproduce the same signal multiple times so that the accumulated duration of the acquisition windows is long enough to acquire the entire k-space. A small acquisition window is good for reducing imaging artifacts because the signal variation within the k-space is minimal. However, this approach requires a large number of repetitions, which results in a longer-duration scan. Therefore, a trade-off has to be made between the image quality and the acquisition speed. A TSE sequence uses a longer acquisition window to acquire more echoes within a sequence repetition whereas a conventional spin echo (CSE) only acquires one echo. Although the TSE is more efficient than the CSE, the images may have blurring artifacts due to the T2 signal decay within the larger acquisition window.

The same problem may occur regardless of whether Cartesian or non-Cartesian trajectories are used. For example, in a Radial TSE sequence, where multiple radial spokes are acquired within a large acquisition window, the varying k-space signal may result in streaking artifacts in the reconstructed images. Streaking artifacts also appear in the quantitative T2 maps calculated from the Radial TSE images.

The present disclosure is directed to overcoming these and other problems of at least some MR imaging applications.

SUMMARY

Embodiments of the present invention address and overcome one or more of the above shortcomings and drawbacks, by providing methods, systems, and apparatuses related to a k-space data correction technique In an embodiment, a computer-implemented method for generating an image of a subject using a magnetic resonance imaging (MRI) system includes performing a calibration scan to collect first k-space data, generating a signal variation model based on the first k-space data, performing imaging scans to collect second k-space data, applying the signal variation model to the second k-space data to produce compensated k-space data, and reconstructing the compensated k-space data into an image of the subject.

In another embodiment, a system for performing magnetic resonance imaging (MRI) of a subject includes a pulse sequence system configured to generate a pulse sequence. The pulse sequence system includes a gradient system, a plurality of gradient coils, a radio-frequency system, and a plurality of RF coils. The pulse sequence system is configured to cause the subject to emit MR signals which are captured as k-space data by the pulse sequence system. The system further includes a k-space ordering processor configured to collect first k-space data and second k-space data based on the MR signals emitted by the subject, an MR signal modeler configured to generate a signal variation model based on the first k-space data, a compensation module configured to apply the signal variation model to the second k-space data collected to produce compensated k-space data, and a display processor configured to reconstruct the compensated k-space data into an image of the subject.

In another embodiment, a computer program product includes a non-transitory, tangible computer-readable medium holding computer-executable instructions for performing a method according to disclosed embodiments.

Additional features and advantages of the invention will be made apparent from the following detailed description of illustrative embodiments that proceeds with reference to the accompanying drawings.

BRIEF DESCRIPTION OF THE DRAWINGS

The foregoing and other aspects of the present invention are best understood from the following detailed description when read in connection with the accompanying drawings. For the purpose of illustrating the invention, there are shown in the drawings embodiments that are presently preferred, it being understood, however, that the invention is not limited to the specific instrumentalities disclosed. Included in the drawings are the following Figures.

DETAILED DESCRIPTION

An exemplary disclosed k-space signal correction technique includes estimation of a k-space signal curve from k-space data acquired during a calibration scan and use of the signal variation curve to correct collected k-space data before an image reconstruction. The exemplary k-space signal correction technique compensates for signal variation within the k-space acquisition window, such as variation due to T2-decay. A signal variation model is generated based on the estimation of the k-space signal curve. The k-space signal curve is derived from calibration scans either separate from, or integrated with the actual imaging scan. K-space data is compensated using the inverse of the k-space signal curve before undergoing the standard image reconstruction. The compensation reduces the artifacts associated with signal variation in various MRI applications.

Figure 1:
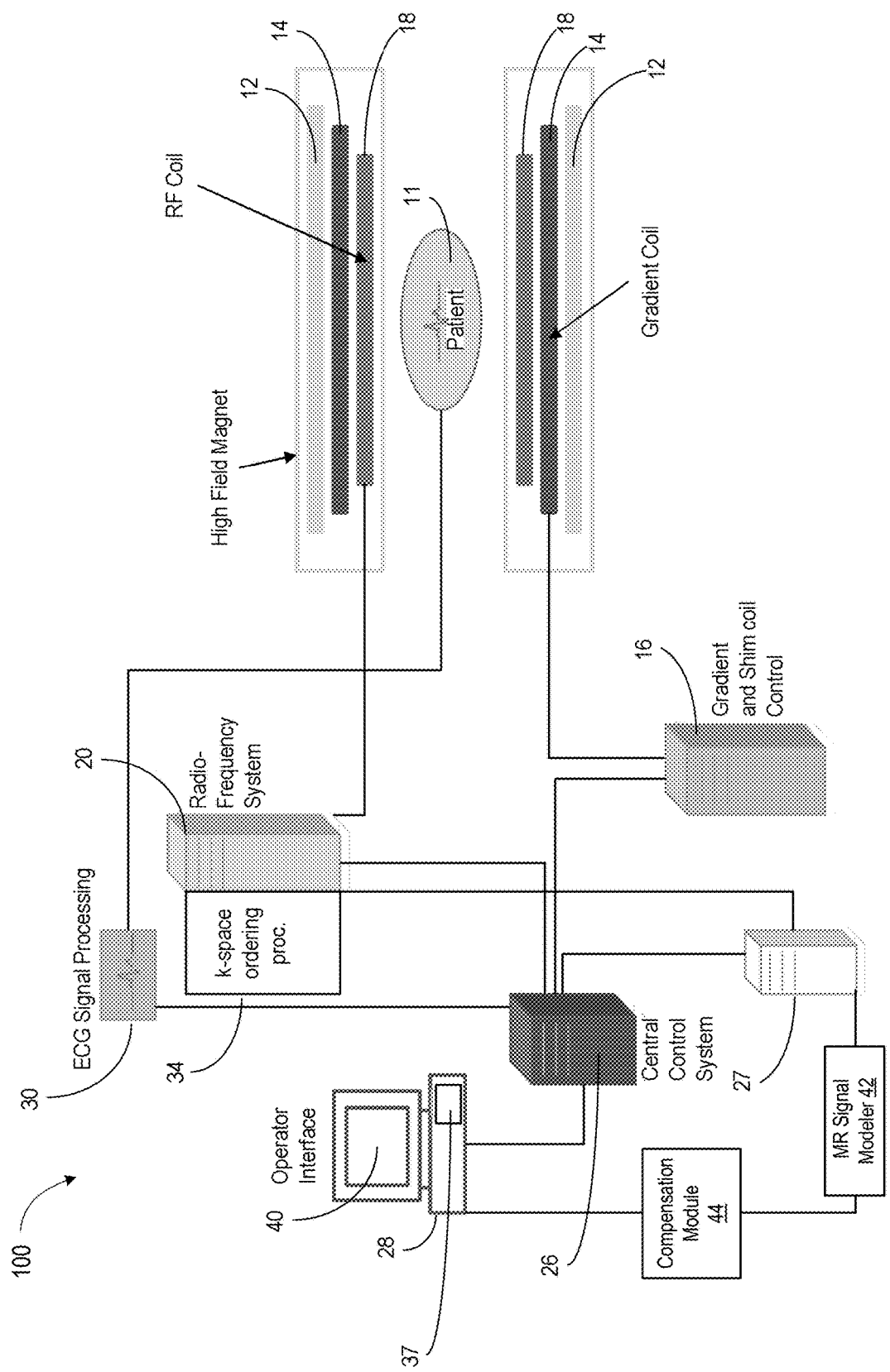
FIG. 1 is a schematic diagram of an exemplary MRI system, consistent with some of the disclosed embodiments.

FIG. 1 shows an example system 100 where the signal correction technique discussed herein may be implemented, according to some embodiments. This system 100 orders the acquisition of frequency domain components representing magnetic resonance imaging (MRI) data for storage in a k-space storage array. The system 100 is an example of an MRI system configured to perform an imaging sequence in order to collect k-space data that may be used in imaging or other applications.

In system 100, magnetic coils 12 create a static base magnetic field in the body of subject 11 to be imaged and positioned on a table. Within the magnet system are gradient coils 14 for producing position dependent magnetic field gradients superimposed on the static magnetic field. Gradient coils 14, in response to gradient signals supplied thereto by a gradient and shim coil control module 16, produce position dependent and shimmed magnetic field gradients in three orthogonal directions and generate magnetic field pulse sequences. The shimmed gradients compensate for inhomogeneity and variability in an MRI device magnetic field resulting from subject anatomical variation and other sources. The magnetic field gradients include a slice-selection gradient magnetic field, a phase-encoding gradient magnetic field and a readout gradient magnetic field that are applied to subject 11.

Radio frequency (RF) module 20 provides RF pulse signals to RF coil 18, which in response produces magnetic field pulses which rotate the spins of the protons in the imaged body of the subject 11 by ninety degrees or by one hundred and eighty degrees for so-called "spin echo" (SE) imaging, or by angles less than or equal to ninety degrees for so-called "gradient echo" (GRE) imaging. Gradient and shim coil control module 16 in conjunction with RF module 20, as directed by central control unit 26, control slice-selection, phase-encoding, readout gradient magnetic fields, radio frequency transmission, and magnetic resonance signal detection, to acquire magnetic resonance signals representing planar slices of subject 11.

In response to applied RF pulse signals, the RF coil 18 (or a separate RF-receiving coil) receives MR signals, i.e., signals from the excited protons within the body as they return to an equilibrium position established by the static and gradient magnetic fields. The MR signals are detected and processed by a detector within RF module 20 and k-space component processor unit 34 to provide a k-space dataset to an image data processor for processing into an image. In some embodiments, the image data processor is located in central control unit 26. However, in other embodiments such as the one depicted in FIG. 1, the image data processor is located in a separate unit 27. An electrocardiogram (ECG) synchronization signal generator 30 may provide ECG signals used for pulse sequence and imaging synchronization. A two or three dimensional k-space storage array of individual data elements in k-space component processor unit 34 stores corresponding individual frequency components comprising a k-space dataset. The k-space array of individual data elements has a designated center and individual data elements individually have a radius to the designated center.

There are a number of parameters which should be set for MRI system 100 to perform an imaging sequence. For example, these parameters include time-to-echo (TE) and time-to-repeat (TR). TR is a period of time during which a pulse sequence is applied and at least one echo is acquired before the pulse sequence is repeated. In TSE imaging, an additional parameter of number of echoes per echo-train (also called turbo-factor (TF) or echo-train-length (ETL)) determines the number of lines of k-space that can be acquired during a single acquisition window. A similar ETL parameter is used in echo planar imaging (EPI), which similarly includes a pulse sequence in which multiple echoes are acquired in a single acquisition window within a selected k-space plane. MRI system 100 can perform sequences according to parameter values selected based on the desired imaging results and characteristics. For example, different MRI sequences can be configured for T1, T2, and/or T2* image contrast (T1-, T2-, or T2*-weighting, respectively), depending on the selected parameters and imaging technique (e.g., TSE, CSE, EPI, etc.) used.

In an exemplary embodiment, a magnetic field generator (e.g., comprising coils 12, 14, and 18) generates a magnetic field for use in acquiring multiple individual frequency components corresponding to individual data elements in the storage array. The individual frequency components are successively acquired during acquisition of a k-space dataset representing an MR image. A storage processor in the k-space component processor unit 34 stores individual frequency components acquired using the magnetic field in corresponding individual data elements in the k-space array.

In one embodiment, central control unit 26 uses information stored in an internal database to process the detected MR signals in a coordinated manner to generate high quality images of a selected slice(s) of the body (e.g., using the image data processor) and adjusts other parameters of system 100. The stored information comprises predetermined pulse sequence and magnetic field gradient and strength data as well as data indicating timing, orientation and spatial volume of gradient magnetic fields to be applied in imaging. Generated images are presented on display 40 of the operator interface. Computer 28 of the operator interface includes a graphical user interface (GUI) enabling user interaction with central control unit 26 and enables user modification of magnetic resonance imaging signals in substantially real time. Continuing with reference to FIG. 1, display processor 37 processes the MR signals to reconstruct one or more images for presentation on display 40, for example. Various techniques may be used for reconstruction, including a method using compensation based on calibration data, as described herein.

In an exemplary embodiment, the system 100 further includes an MR signal modeler 42 and a compensation module 44. The MR signal modeler 42 and the compensation module 44 may be software and/or hardware components of the system 100. In some embodiments, the MR signal modeler 42 and/or the compensation module 44 may be stored on or otherwise associated with the central control unit 26, the separate unit 27, the RF module 20, or another component of the system 100. In other embodiments, the signal modeler 42 and/or the compensation module 44 may be separate units and/or combined with each other.

Figure 2:
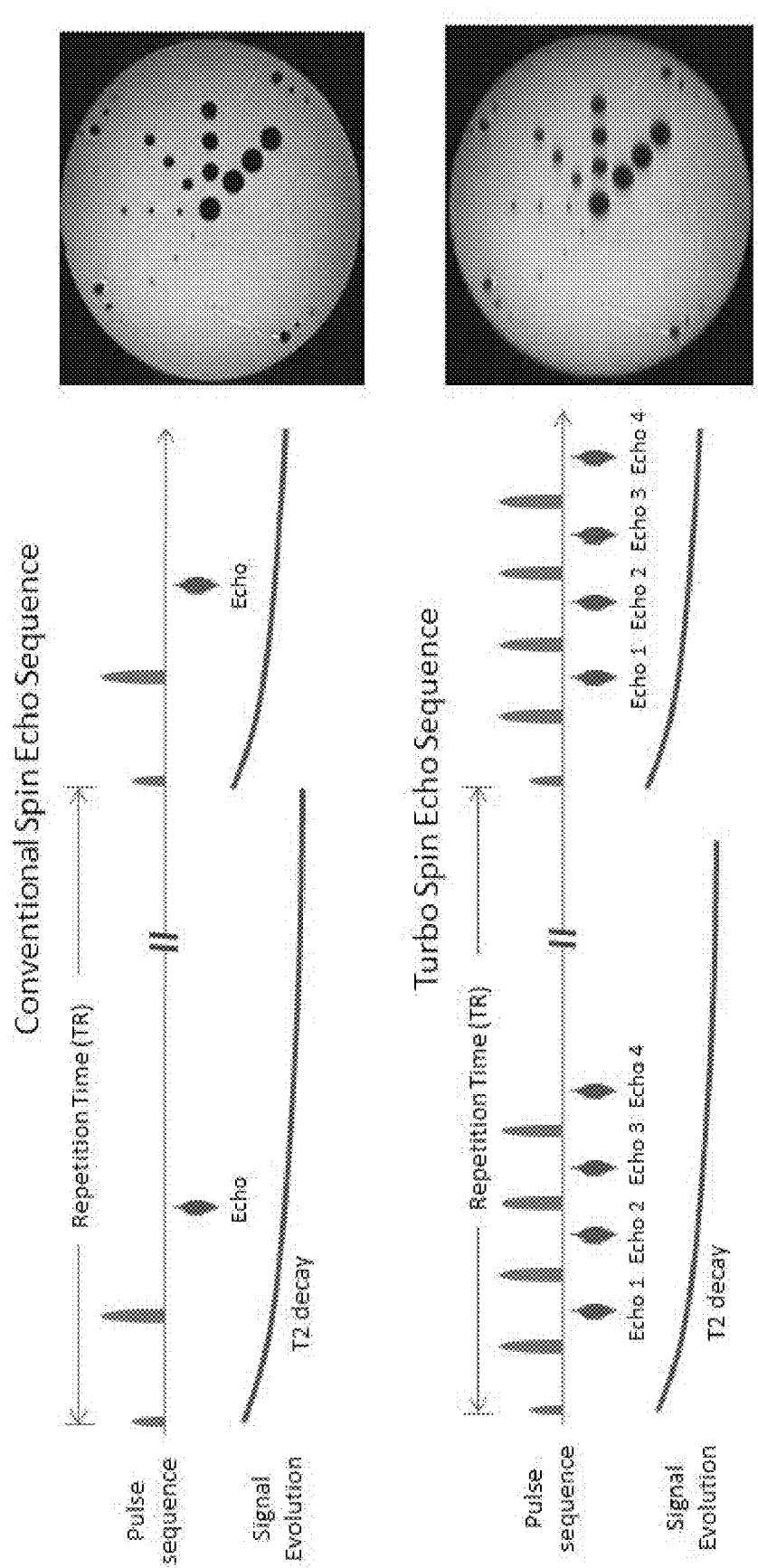
FIG. 2 is a diagram of prior art spin echo sequences including conventional spin echo and turbo spin echo, together with a representative image produced from the associated sequence and a representation of a varying MR signal.

The MR signal modeler 42 is configured to receive k-space data and produce a signal variation model. The signal variation model may be a representation of a received MR signal derived from the acquired k-space data. For example, the signal variation model may include an estimation of an MR signal curve within an acquisition window (when ADC is turned on). As described herein, a parameter (e.g., intensity) of an MR signal varies during the acquisition window. For example, as seen in FIG. 2, T2 decay occurs during the acquisition window of TSE sequences, resulting in a varying MR signal. As a result, echoes acquired earlier in the acquisition window are associated with a different signal state (e.g., intensity) than echoes acquired later in the acquisition window. For example, the TSE sequence illustrated in FIG. 2 shows that Echo 1 occurs at a different signal condition than Echo 4, represented by the signal evolution curve representing T2 decay. This may result in a streaking or blurring artifacts in the images produced from TSE, as compared to the CSE reconstructed images produce from longer-duration scans. Returning to FIG. 1, the MR signal modeler 42 is configured to use k-space data to produce a signal variation model, which may be an estimation of the MR signal curve (e.g., the T2 decay curve).

The compensation module 44 is configured to apply the signal variation model to k-space data in the k-space data array prior to reconstruction to produce compensated data. In one embodiment, the compensation module 44 is configured to adjust k-space data based on the signal variation model generated by the MR signal modeler 42. For example, the compensation module 44 may modify k-space data values based on an inverse of the estimation of the MR signal curve to produce the compensated k-space data. The compensation module 44 is configured to transmit the compensated k-space data to the display processor 37, for example, for reconstruction of the compensated k-space data into one or more images of the subject 11.

Figure 3:
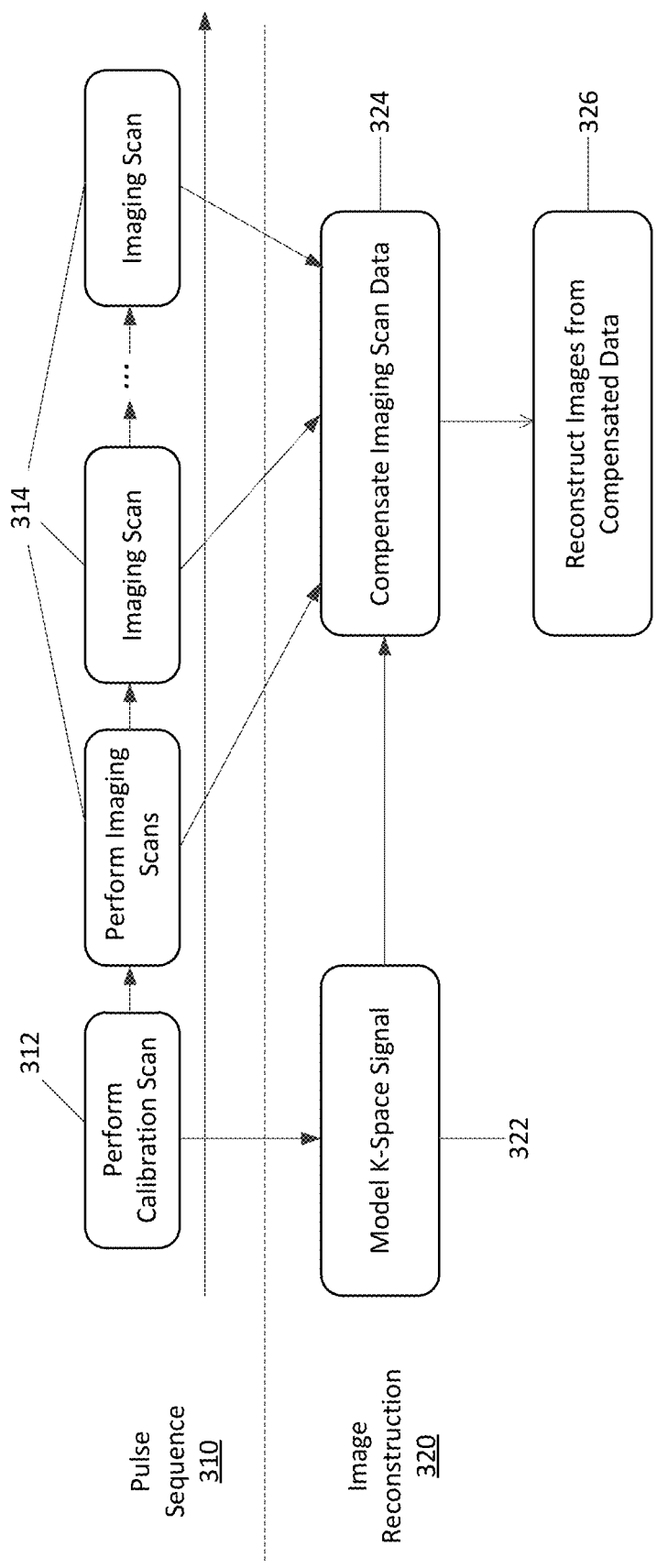
FIG. 3 is a diagram of a k-space data correction method, according to exemplary embodiments.

FIG. 3 is a diagram of an example process 300 for producing MR images based on compensated k-space data. The MR system 100 is configured to apply a repeating pulse sequence 310 to collect k-space data. For example, a pulse sequence system (e.g., comprising a gradient system such as gradient and shim control 16, gradient coils 14, RF system 20, and RF coils 18) may control a gradient and RF pulse sequence associated with an MR imaging technique (e.g., TSE, EPI, etc.). The pulse sequence system applies the pulse sequence 310 and thus causes the subject 11 to emit MR signals that are received (e.g., by RF coils 18) as k-space data.

In addition to pulse sequence 310, the process 300 further includes image reconstruction 320. For example, one or more components of system 100 may use data collected as a result of the pulse sequence 310 to produce one or more images of the subject 11. For example, one or more of the k-space ordering processor 34, central control system 26, separate unit 27, display processor 37, MR signal modeler 42, compensation module 44, etc. of the system 100 may work in conjunction with each other to transform k-space data received as a result of the pulse sequence 310 into an image of the subject 11 that may be presented on the display 40.

In an exemplary embodiment, the pulse sequence 310 includes a calibration scan 312. The calibration scan 312 includes collection of first k-space data. For example, the k-space data may include amplitude or magnitude data related to the MR signal emitted from the subject 11. One or more imaging scans 314 follow the calibration scan 312. The imaging scans 314 may be repeated according to a TR parameter. As a result, the MR system may collect additional k-space data (which may be considered second k-space data). The k-space data may include information for a k-space data array sufficient to produce MR images using standard reconstruction techniques.

In some embodiments, the calibration scan 312 is separated from the imaging scans 314. In other embodiments, the calibration scan 312 could be integrated with an imaging scan 314. For example, when radial sampling is used, the k-space center signal from all the radial spokes of a normal imaging scan 314 could be used as calibration data.

In image reconstruction 320, MR signal modeler 42 uses the first k-space data from the calibration scan to produce a signal variation model in step 322. In some embodiments, the signal variation model may be an estimation of an MR signal curve during an acquisition window. For example, the signal variation model may be a representation of T2 decay, with the MR signal curve decreasing over time. The signal variation model may further include a transformation algorithm derived from the estimation of the MR signal curve. For example, the signal variation model may determine how to normalize k-space data to a constant MR signal based on the estimation of the varying MR signal. The normalization may be based on an inverse of the estimated MR signal curve. For instance, where the intensity of the of the MR signal is estimated to be the highest, compensation may be at its lowest. Conversely, areas of low MR signal intensity may be highly compensated.

In step 324, the compensation module 44 may use the second k-space data from the imaging scans to correct the data for the signal variation that is modeled by the MR signal modeler 42. For example, the compensation module 44 may apply the signal variation model to the k-space data to modify the k-space data and produced compensated data. In some embodiments, the compensation module 44 may perform a normalization process using an inverse of the estimation of the MR signal curve. In step 326 the compensated data may be reconstructed into MR images (e.g., by the display processor 37). The reconstructed images based on the compensated data may have reduced artifacts and greater clarity compared to images that could have been constructed from the second k-space data without compensation.

Figure 4:
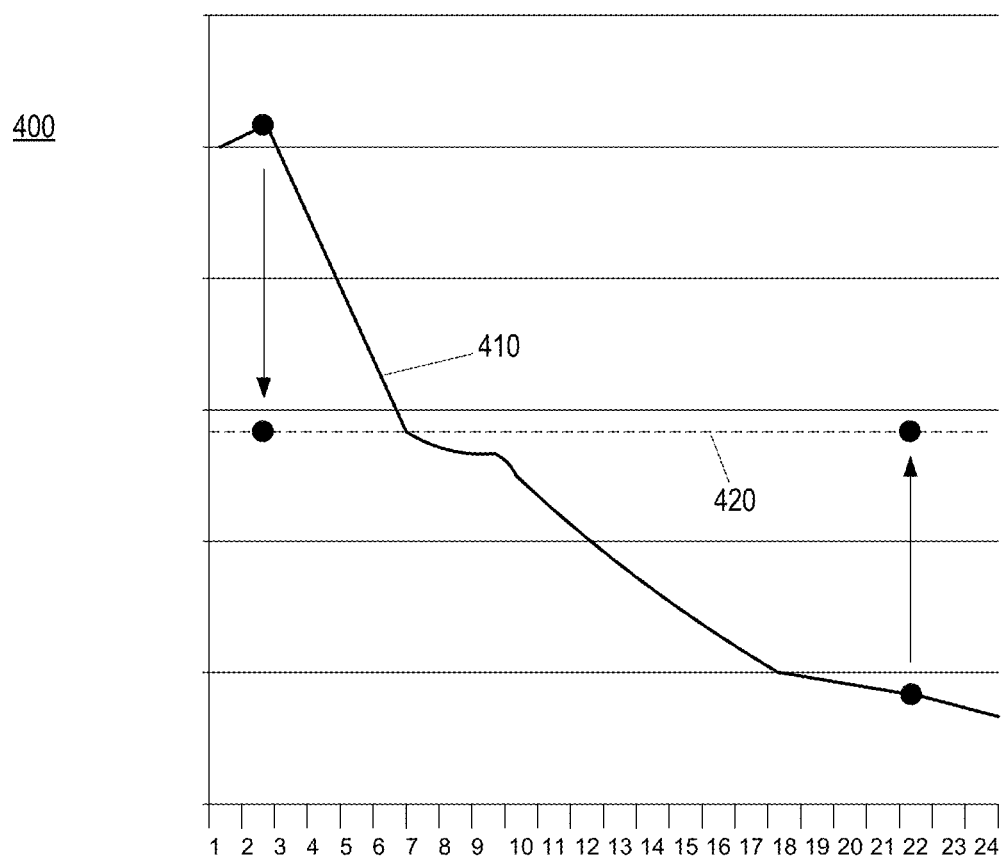
FIG. 4 is a representation of an estimation of an MR signal and a compensated MR signal, according to exemplary embodiments.

FIG. 4 is an exemplary graph 400 of an estimation of an MR signal curve 410. The MR signal modeler 42 may generate the MR signal curve 410 based on k-space data acquired during a calibration scan 312. The MR signal modeler 42 may also determine a normalized signal 420 which may be a constant value for the MR signal. The MR signal modeler 42 may calculate a difference between the curve 410 and the normalized signal 420 to prepare a compensation modifier for correcting k-space data collected during the imaging scans 314.

In the MR pulse sequence 310 for k-space data acquisition, the MR system 100 may repeatedly acquire the same k-space region (i.e. k-space centerline) over time in order to capture and estimate the MR signal variation. In other words, the calibration scan 312 may include collection of k-space data using overlapping k-space projections during an acquisition window. For example, the calibration scan 314 may include a radial k-space traversal in which associated k-space projections are radially offset and overlap near a center of k-space. This option effectively utilizes the characteristic of radial k-space techniques to include k-space projections that each pass through k-space center. In another example, the calibration scan 314 includes a k-space traversal in which a k-space projection near a center of k-space is repeated. In Cartesian k-space techniques, the projections do not all pass through a center of k-space. Therefore, in some embodiments, a center k-space projection may be repeated during an acquisition window such that k-space center data is acquired during the entire time period.

The k-space data acquired during the calibration scan 312 is transferred to the MR signal modeler 42, which is one of the image reconstruction components. The MR signal modeler 42 generates a signal variation model based on the k-space data of the calibration scan 312. In some embodiments, the MR signal modeler 42 generates a signal variation model independently for each RF coil 18.

K-space data acquired during imaging scans 314 is modified by the compensation module 44 using the signal variation model before undergoing the standard image reconstruction. In some embodiments, the compensation module 44 compensates the k-space data separately for each RF coil 18, such as in the case of parallel imaging, prior to combination of the data during image reconstruction.

Figure 5:
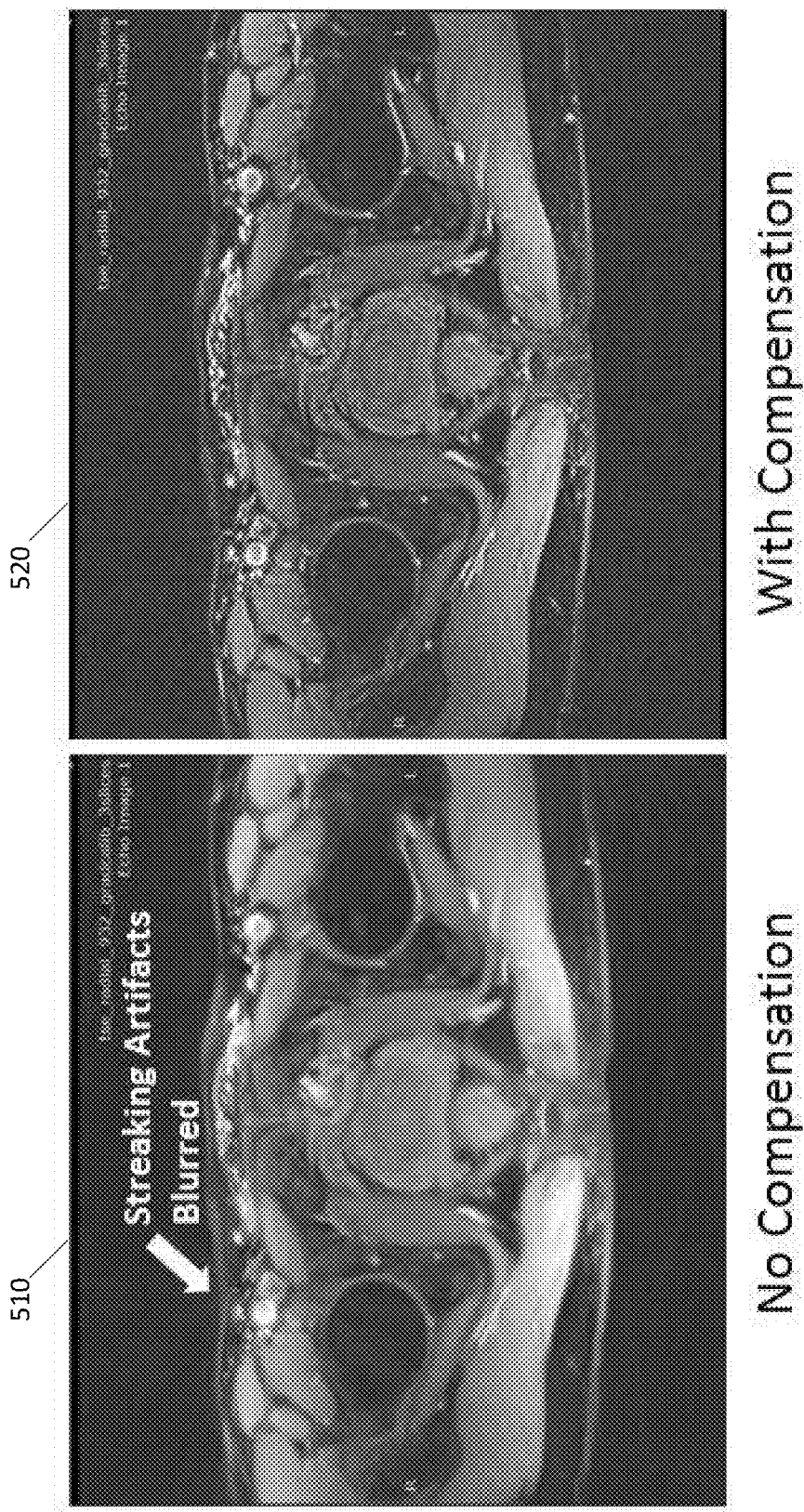
FIG. 5A is an image of a subject reconstructed from data that has not been compensated using an exemplary disclosed method.
FIG. 5B is an image of a subject reconstructed from data that has been compensated using an exemplary disclosed method.

FIGS. 5A and 5B show examples in-vivo radial TSE images with and without the disclosed compensation method. FIG. 5A is an example of an image 510 in which data compensation was not applied. FIG. 5B is an example of a corresponding image 520 in which data compensation was applied. In addition to the reduced streaking artifacts, the image 520 with correction is sharper than the image 510 without correction. As a result, more details of the underlying anatomy could be visualized by the image with the proposed correction technique.

In addition to TSE and EPI sequences, the disclosed methods could also be applied to other pulse sequences to compensate for signal evolutions and variation among different k-space lines. For example, it could be applied in multi-echo gradient echo sequence to compensate for signal variation due to T2* decay. In balanced Steady-State Free Precession (bSSFP) sequence, the technique could be applied to compensate for the signal variation before reaching steady-state. In this way, the data acquired before reaching steady-state could be utilized to improve the scan efficiency without compromising the image quality.

Figure 6:
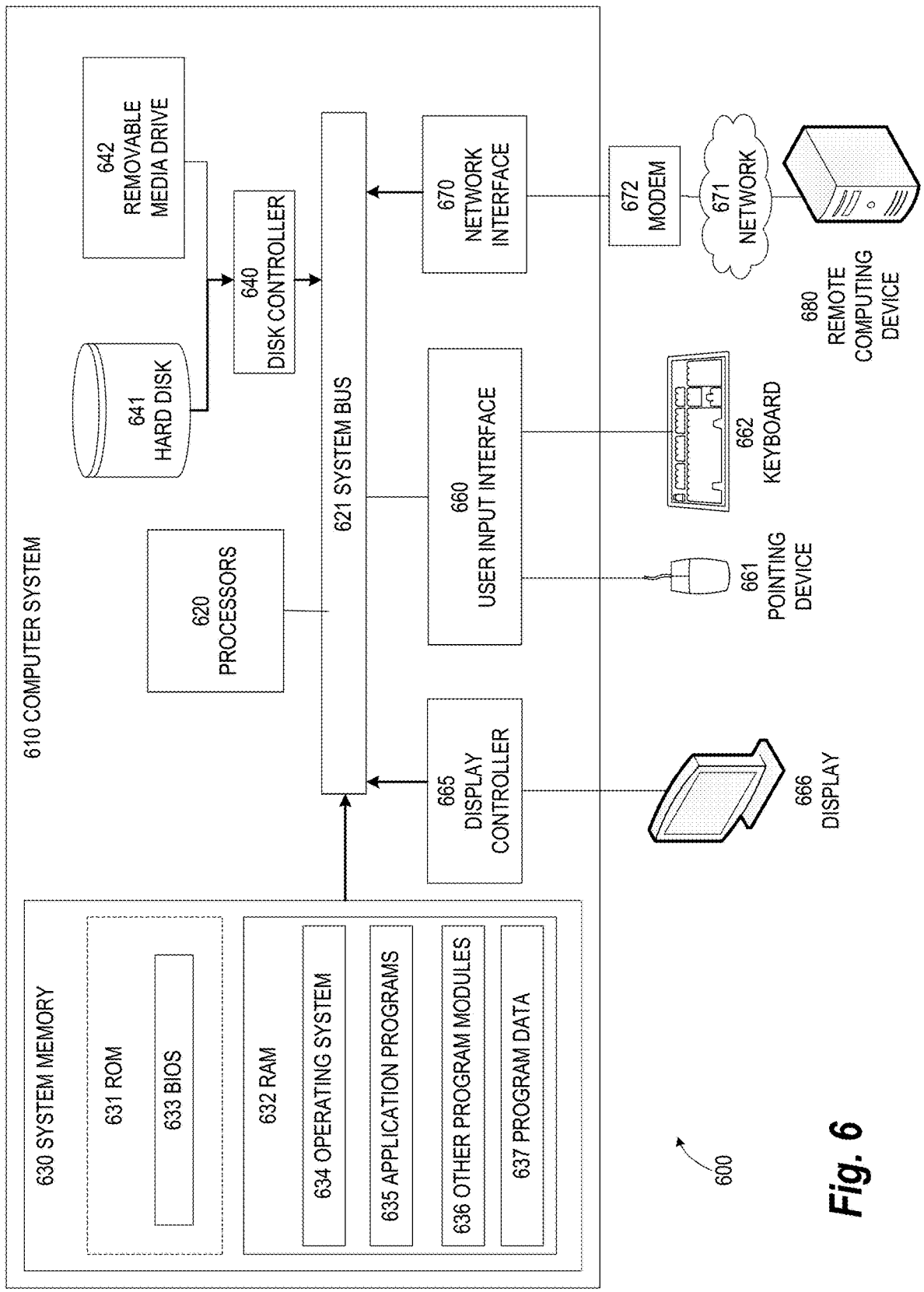
FIG. 6 is a depiction of an exemplary computing environment within which some of the disclosed embodiments may be implemented.

FIG. 6 illustrates an exemplary computing environment 600 within which embodiments of the invention may be implemented. For example, this computing environment 600 may be configured to execute an imaging process performed by the MRI system 100. The computing environment 600 may include computer system 610, which is one example of a computing system upon which embodiments of the invention may be implemented. Computers and computing environments, such as computer system 610 and computing environment 600, are known to those of skill in the art and thus are described briefly here.

As shown in FIG. 6, the computer system 610 may include a communication mechanism such as a bus 621 or other communication mechanism for communicating information within the computer system 610. The computer system 610 further includes one or more processors 620 coupled with the bus 621 for processing the information. The processors 620 may include one or more central processing units (CPUs), graphical processing units (GPUs), or any other processor known in the art.

The computer system 610 also includes a system memory 630 coupled to the bus 621 for storing information and instructions to be executed by processors 620. The system memory 630 may include computer readable storage media in the form of volatile and/or nonvolatile memory, such as read only memory (ROM) 631 and/or random access memory (RAM) 632. The system memory RAM 632 may include other dynamic storage device(s) (e.g., dynamic RAM, static RAM, and synchronous DRAM). The system memory ROM 631 may include other static storage device(s) (e.g., programmable ROM, erasable PROM, and electrically erasable PROM). In addition, the system memory 630 may be used for storing temporary variables or other intermediate information during the execution of instructions by the processors 620. A basic input/output system (BIOS) 633 containing the basic routines that help to transfer information between elements within computer system 610, such as during start-up, may be stored in ROM 631. RAM 632 may contain data and/or program modules that are immediately accessible to and/or presently being operated on by the processors 620. System memory 630 may additionally include, for example, operating system 634, application programs 635, other program modules 636 and program data 637.

The computer system 610 also includes a disk controller 640 coupled to the bus 621 to control one or more storage devices for storing information and instructions, such as a hard disk 641 and a removable media drive 642 (e.g., floppy disk drive, compact disc drive, tape drive, and/or solid state drive). The storage devices may be added to the computer system 610 using an appropriate device interface (e.g., a small computer system interface (SCSI), integrated device electronics (IDE), Universal Serial Bus (USB), or FireWire).

The computer system 610 may also include a display controller 665 coupled to the bus 621 to control a display 666, such as a cathode ray tube (CRT) or liquid crystal display (LCD), for displaying information to a computer user. The computer system 610 includes an input interface 660 and one or more input devices, such as a keyboard 662 and a pointing device 661, for interacting with a computer user and providing information to the processor 620. The pointing device 661, for example, may be a mouse, a trackball, or a pointing stick for communicating direction information and command selections to the processor 620 and for controlling cursor movement on the display 666. The display 666 may provide a touch screen interface which allows input to supplement or replace the communication of direction information and command selections by the pointing device 661.

The computer system 610 may perform a portion or all of the processing steps of embodiments of the invention in response to the processors 620 executing one or more sequences of one or more instructions contained in a memory, such as the system memory 630. Such instructions may be read into the system memory 630 from another computer readable medium, such as a hard disk 641 or a removable media drive 642. The hard disk 641 may contain one or more datastores and data files used by embodiments of the present invention. Datastore contents and data files may be encrypted to improve security. The processors 620 may also be employed in a multi-processing arrangement to execute the one or more sequences of instructions contained in system memory 630. In alternative embodiments, hardwired circuitry may be used in place of or in combination with software instructions. Thus, embodiments are not limited to any specific combination of hardware circuitry and software.

As stated above, the computer system 610 may include at least one computer readable medium or memory for holding instructions programmed according to embodiments of the invention and for containing data structures, tables, records, or other data described herein. The term "computer readable medium" as used herein refers to any medium that participates in providing instructions to the processor 620 for execution. A computer readable medium may take many forms including, but not limited to, non-volatile media, volatile media, and transmission media. Non-limiting examples of non-volatile media include optical disks, solid state drives, magnetic disks, and magneto-optical disks, such as hard disk 641 or removable media drive 642. Non-limiting examples of volatile media include dynamic memory, such as system memory 630. Non-limiting examples of transmission media include coaxial cables, copper wire, and fiber optics, including the wires that make up the bus 621. Transmission media may also take the form of acoustic or light waves, such as those generated during radio wave and infrared data communications.

The computing environment 600 may further include the computer system 610 operating in a networked environment using logical connections to one or more remote computers, such as remote computer 680. Remote computer 680 may be a personal computer (laptop or desktop), a mobile device, a server, a router, a network PC, a peer device or other common network node, and typically includes many or all of the elements described above relative to computer system 610. When used in a networking environment, computer system 610 may include modem 672 for establishing communications over a network 671, such as the Internet. Modem 672 may be connected to bus 621 via user network interface 670, or via another appropriate mechanism.

Network 671 may be any network or system generally known in the art, including the Internet, an intranet, a local area network (LAN), a wide area network (WAN), a metropolitan area network (MAN), a direct connection or series of connections, a cellular telephone network, or any other network or medium capable of facilitating communication between computer system 610 and other computers (e.g., remote computer 680). The network 671 may be wired, wireless or a combination thereof. Wired connections may be implemented using Ethernet, Universal Serial Bus (USB), RJ-11 or any other wired connection generally known in the art. Wireless connections may be implemented using Wi-Fi, WiMAX, and Bluetooth, infrared, cellular networks, satellite or any other wireless connection methodology generally known in the art. Additionally, several networks may work alone or in communication with each other to facilitate communication in the network 671.

The embodiments of the present disclosure may be implemented with any combination of hardware and software. In addition, the embodiments of the present disclosure may be included in an article of manufacture (e.g., one or more computer program products) having, for example, computer-readable, non-transitory media. The media has embodied therein, for instance, computer readable program code for providing and facilitating the mechanisms of the embodiments of the present disclosure. The article of manufacture can be included as part of a computer system or sold separately.

While various aspects and embodiments have been disclosed herein, other aspects and embodiments will be apparent to those skilled in the art. The various aspects and embodiments disclosed herein are for purposes of illustration and are not intended to be limiting, with the true scope and spirit being indicated by the following claims.

An executable application, as used herein, comprises code or machine readable instructions for conditioning the processor to implement predetermined functions, such as those of an operating system, a context data acquisition system or other information processing system, for example, in response to user command or input. An executable procedure is a segment of code or machine readable instruction, sub-routine, or other distinct section of code or portion of an executable application for performing one or more particular processes. These processes may include receiving input data and/or parameters, performing operations on received input data and/or performing functions in response to received input parameters, and providing resulting output data and/or parameters.

A graphical user interface (GUI), as used herein, comprises one or more display images, generated by a display processor and enabling user interaction with a processor or other device and associated data acquisition and processing functions. The GUI also includes an executable procedure or executable application. The executable procedure or executable application conditions the display processor to generate signals representing the GUI display images. These signals are supplied to a display device which displays the image for viewing by the user. The processor, under control of an executable procedure or executable application, manipulates the GUI display images in response to signals received from the input devices. In this way, the user may interact with the display image using the input devices, enabling user interaction with the processor or other device.

The functions and process steps herein may be performed automatically or wholly or partially in response to user command. An activity (including a step) performed automatically is performed in response to one or more executable instructions or device operation without user direct initiation of the activity.

The system and processes of the figures are not exclusive. Other systems, processes and menus may be derived in accordance with the principles of the invention to accomplish the same objectives. Although this invention has been described with reference to particular embodiments, it is to be understood that the embodiments and variations shown and described herein are for illustration purposes only. Modifications to the current design may be implemented by those skilled in the art, without departing from the scope of the invention. As described herein, the various systems, subsystems, agents, managers and processes can be implemented using hardware components, software components, and/or combinations thereof. No claim element herein is to be construed under the provisions of 35 U.S.C. 112(f) unless the element is expressly recited using the phrase "means for."

The invention claimed is:

1. A computer-implemented method for generating an image of a subject using a magnetic resonance imaging (MRI) system, comprising:
   performing a calibration scan to collect first k-space data;
   estimating a varying MR signal curve based on the first k-space data;
   normalizing the first k-space data to a constant MR signal based on the estimated varying MR signal curve;
   calculating a difference between the varying MR signal curve and the constant MR signal;
   performing imaging scans to collect second k-space data;
   modifying the second k-space data based on the difference to produce compensated second k-space data; and
   reconstructing the compensated second k-space data into an image of the subject.

2. A system for performing magnetic resonance imaging (MRI) of a subject, the system comprising:
   a pulse sequence system configured to generate a pulse sequence, comprising:
      a gradient system;
      a plurality of gradient coils;
      a radio-frequency (RF) system; and
      a plurality of RF coils, wherein the pulse sequence system is configured to cause the subject to emit MR signals which are captured as k-space data by the pulse sequence system;

a k-space ordering processor configured to collect first k-space data and second k-space data based on the MR signals emitted by the subject;

an MR signal modeler configured to generate a signal variation model based on the first k-space data, wherein the signal variation model is configured to estimate a varying MR signal curve based on the first k-space data; normalize the first k-space data to a constant MR signal based on the estimated varying MR signal curve; and calculate a difference between the varying MR signal curve and the constant MR signal;

a compensation module configured to apply the signal variation model to modify the second k-space data based on the difference to produce compensated second k-space data; and a display processor configured to reconstruct the compensated second k-space data into an image of the subject.

3. A computer program product comprising a non-transitory, tangible computer-readable medium holding computer-executable instructions for performing a method comprising:

receiving first k-space data from a calibration scan;

estimating a varying MR signal curve based on the first k-space data;

normalizing the first k-space data to a constant MR signal based on the estimated varying MR signal curve;

calculating a difference between the varying MR signal curve and the constant MR signal;

receiving second k-space data from imaging scans;

modifying the second k-space data based on the difference to produce compensated second k-space data; and reconstructing the compensated second k-space data into an image of the subject.

4. The method of claim 1, wherein the calibration scan comprises collection of the first k-space data using overlapping k-space samples during an acquisition window.

5. The method of claim 4, wherein the calibration scan comprises a radial k-space traversal in which associated k-space projections are radially offset and overlap near a center of k-space.

6. The method of claim 4, wherein the calibration scan comprises a k-space traversal in which a k-space projection near a center of k-space is repeated.

7. The method of claim 1, wherein the first k-space data comprises signal intensity data for a common point, line, or plane during an acquisition window.

8. The method of claim 1, wherein compensation of the second k-space data is inversely correlated with a signal intensity of the varying MR signal curve.

9. The method of claim 1, wherein performing imaging scans comprises performing turbo-spin echo imaging.

10. The system of claim 2, wherein the MR signal modeler is configured to generate an individual signal variation model for each separate RF coil.

11. The system of claim 2, wherein the pulse sequence includes overlapping k-space projections during an acquisition window.

12. The system of claim 11, wherein the pulse sequence includes a radial k-space traversal in which associated k-space projections are radially offset and overlap near a center of k-space.

13. The system of claim 11, wherein the pulse sequence comprises a k-space traversal in which a k-space projection near a center of k-space is repeated.

14. The system of claim 2, wherein the first k-space data comprises signal intensity data for a common point, line, or plane during an acquisition window.

15. The system of claim 2, wherein adjusting compensation of the second k-space data is inversely correlated with a signal intensity of the varying MR signal curve.

16. The system of claim 2, wherein the pulse sequence is a turbo-spin echo sequence.

* * * * *